US005451914A

United States Patent [19]

Stengel

[11] Patent Number: 5,451,914

[45] Date of Patent: Sep. 19, 1995

[54] MULTI-LAYER RADIO FREQUENCY TRANSFORMER

[75] Inventor: Robert E. Stengel, Ft. Lauderdale, Fla.

[73] Assignee: Motorola, Inc., Schaumburg, Ill.

[21] Appl. No.: 283,472

[22] Filed: Jul. 5, 1994

[51] Int. Cl.⁶ .......................... H03H 7/42; H01P 5/10

[52] U.S. Cl. .......................................... 333/25; 333/26; 333/32; 333/33

[58] Field of Search ....................... 333/25, 26, 32, 33, 333/185, 177, 204, 246; 336/180, 182, 185, 200

[56] References Cited

U.S. PATENT DOCUMENTS

| | | | |
|---|---|---|---|
| 4,494,100 | 1/1985 | Stengel | 336/200 |
| 4,992,769 | 2/1991 | Oppett | 333/25 X |
| 4,999,597 | 3/1991 | Gaynor | 333/246 |
| 5,003,622 | 3/1991 | Ma et al. | 333/26 X |
| 5,061,910 | 10/1991 | Bouny | 333/26 |

*Primary Examiner*—Paul Gensler

*Attorney, Agent, or Firm*—M. Mansour Ghomeshi

[57] ABSTRACT

A transformer (300) includes several layers of substrate (202, 204, 206, 208). Sandwiched between first set of layers (204 and 206) is a runner that forms two interconnected spirals (323 and 324). These spirals run in opposite directions and form two half coils of the transformer primary. Similarly, sandwiched between the second set of layers (204 and 206) is a runner that forms two other interconnected spirals (321 and 322). These spirals run in opposite directions and form two half coils of the transformer secondary. These half coils are magnetically coupled through the substrate (206) which is substantially thinner than the other substrates (204 and 208). Ground layers (210 and 216) discourage horizontal coupling of the electromagnetic flux between the half coils (321, 322, 323, 324), hence improving the vertical flux transfer through the thin layer (206). Components (218) added to the top layer (202) provide for a device, such as an amplifier inclusive of its coupling transformer.

10 Claims, 2 Drawing Sheets

MULTI-LAYER RADIO FREQUENCY TRANSFORMER

TECHNICAL FIELD

This invention is related in general to electronic devices and particularly to transformers and more particularly to radio frequency transformers.

BACKGROUND

Miniaturization of radio communication devices has made significant leaps in the last several years with new developments in integrated circuits (IC). These developments have assisted in the miniaturization of many components. Transformers have long resisted this trend and render the most miniaturization challenge to an electronic circuit designer. Transformers are used extensively in communication devices to provide for a variety of functions such as impedance transformation and isolation. Transformers are also used in the design of amplifiers and mixers for various of functions. The extensive use of transformers has put a dam on designers' attempts to shrink the size of communication devices. Surface mount transformers have rendered some relief to this issue of size, however, at the cost of performance degradation, including insertion loss and bandwidth. It is therefore desired to have a transformer that is volumetrically efficient without the performance degradation of the prior art.

DETAILED DESCRIPTION OF THE PREFERRED EMBODIMENT

To combat the undesirably high height and large volume of transformers, the present invention utilizes a transformer that is as thin as the circuit carrying substrate used in electronic devices. By producing two loops formed on two sides of a substantially thin substrate a transformer is created that enjoys a very wide bandwidth along with a very low insertion loss. These requirements are highly desirable in radio frequency applications, particularly amplifier applications where insertion loss is directly translated into power loss.

Figure 1:
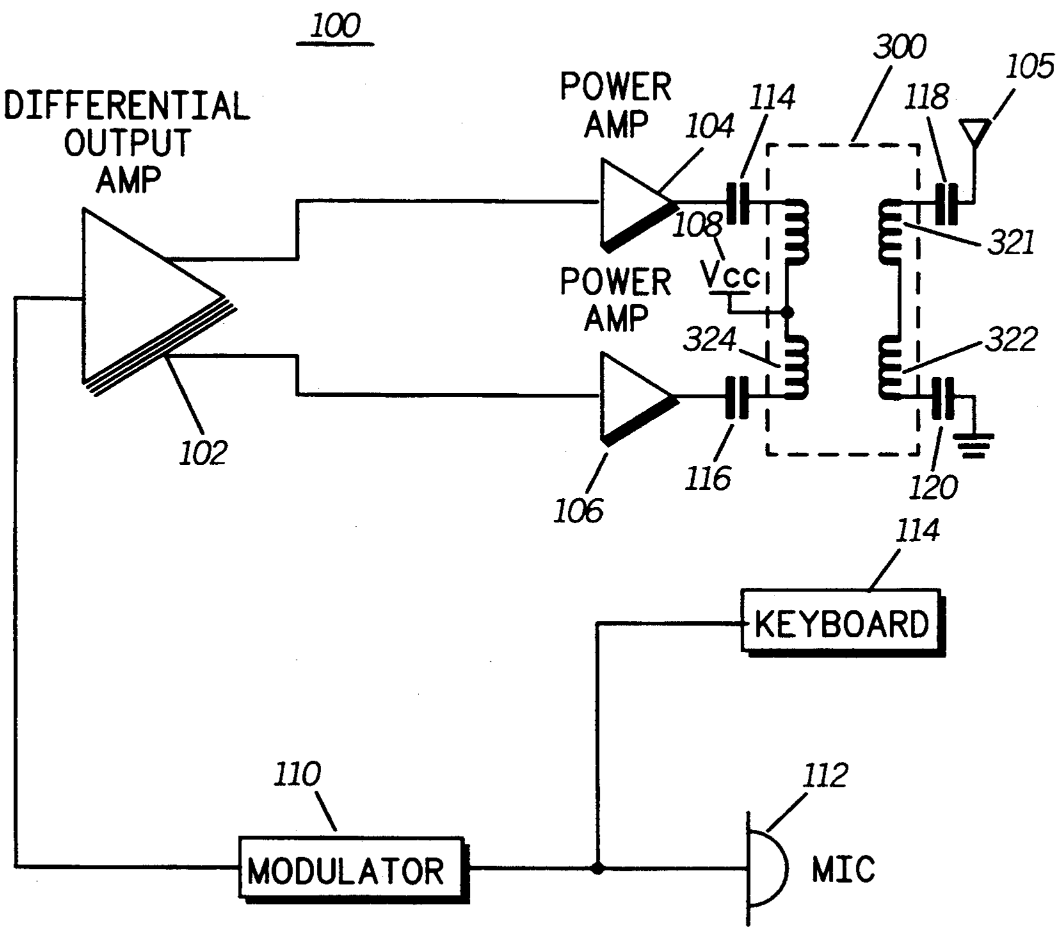
FIG. 1 shows a block diagram of a communication device in accordance with the present invention.

Referring to FIG. 1 a block diagram of a communication device 100 in accordance with the present invention is shown. The device 100 includes a modulator 110 which is used to modulate an analog signal from a microphone 112 and data from a keyboard 122. The modulated signal is coupled from the modulator 110 to a differential output amplifier 102. The differential outputs of the amplifier 102 are coupled to two power amplifiers 104 and 106 which are arranged in a push-pull configuration. The operation of push pull amplifiers is well known in the art. In general, the amplifiers 104 and 106 each work on a half of the modulated signal as applied to them pre-amplified by the amplifier 102. These half signals are separated from each other by 180°. This arrangement provides for a more efficient mechanism to amplify a desired signal using a limited Direct Current (DC) voltage.

The outputs of the two amplifiers 104 and 106 are coupled to a balun (balanced-unbalanced) transformer 300 via capacitors 114 and 116, respectively. Capacitors 114 and 116 resonate (in series) with the inductive loading of the transformer 300. This resonance creates a low impedance at the output of the amplifiers 104 and 106. The capacitance value of capacitors 114 and 116 is based on the application frequency, the self inductance of half coils 323 and 324, and the reactive load required by amplifiers 104 and 106. The transformer 300 includes a center tap 109 which is coupled to a DC voltage source (Vcc) 108. This voltage source acts as an Alternate Current (AC) ground for the transformer 300. The DC continuity across capacitors 114 and 116 is provided by using an inductor with a self resonance well below the frequency of interest. Alternatively, a shunted series stub transmission line element may be used to achieve this objective. The transformer 300 includes four half coils, 323 and 324 on the primary and 321 and 322 on the secondary. The input ports on the primary are coupled to the outputs of the power amplifiers 104 and 106. One port of the secondary is grounded and another is coupled to an antenna 105. Utilizing the transformer 300 the outputs of the amplifiers 104 and 106 are coupled to the antenna 105 in an efficient fashion. In addition to the transformation of the signal, the transformer 300 provides for impedance matching between the amplifiers 104, 106 and the antenna 105.

Figure 2:
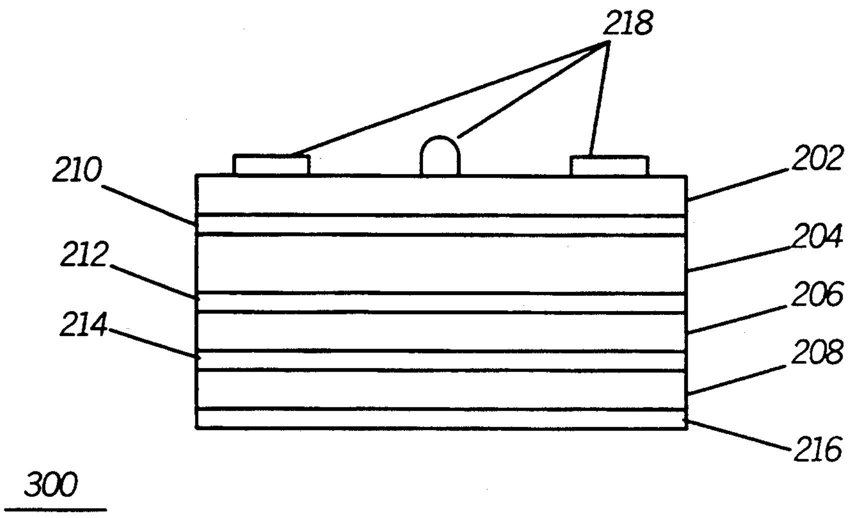
FIG. 2 shows a cross sectional diagram of a transformer in accordance with the present invention.

Referring to FIG. 2 a side view of the transformer 300 in accordance with the present invention is shown. The transformer 300 includes a plurality of substantially fiat substrates of electrically insulating material 202 (fourth layer), 204 (third layer), 206 (first layer), and 208 (second layer). In the preferred embodiment, ceramic with a dielectric constant much higher than air is used. These substrates all have first and second surfaces on which the half coils 321–324 are formed via selective metalization. The selective metalization is formed via substantially fiat runners as shown by layers 210, 212, 214, and 216. The thickness of the several substrates are different in accordance with the present invention. Indeed, in order to accomplish mutual inductance between the layers the middle layer 206 is substantially thinner than the other layers 204 and 208.

The top layer 202 includes a top surface on which components 218 may be placed. In other words, the top surface may be selectively metallized to accommodate an electrical circuit pattern. Components 218 of this circuit may then be added to the selectively metallized pads in order to form an electrical component inclusive of a transformer. In an embodiment of the present invention, the amplifiers 104 and 106 may be added to the top substrate in order to form a stand alone amplifier module. The benefit of this module is its significantly reduced size. Another benefit is that the network is shielded.

Figure 3:
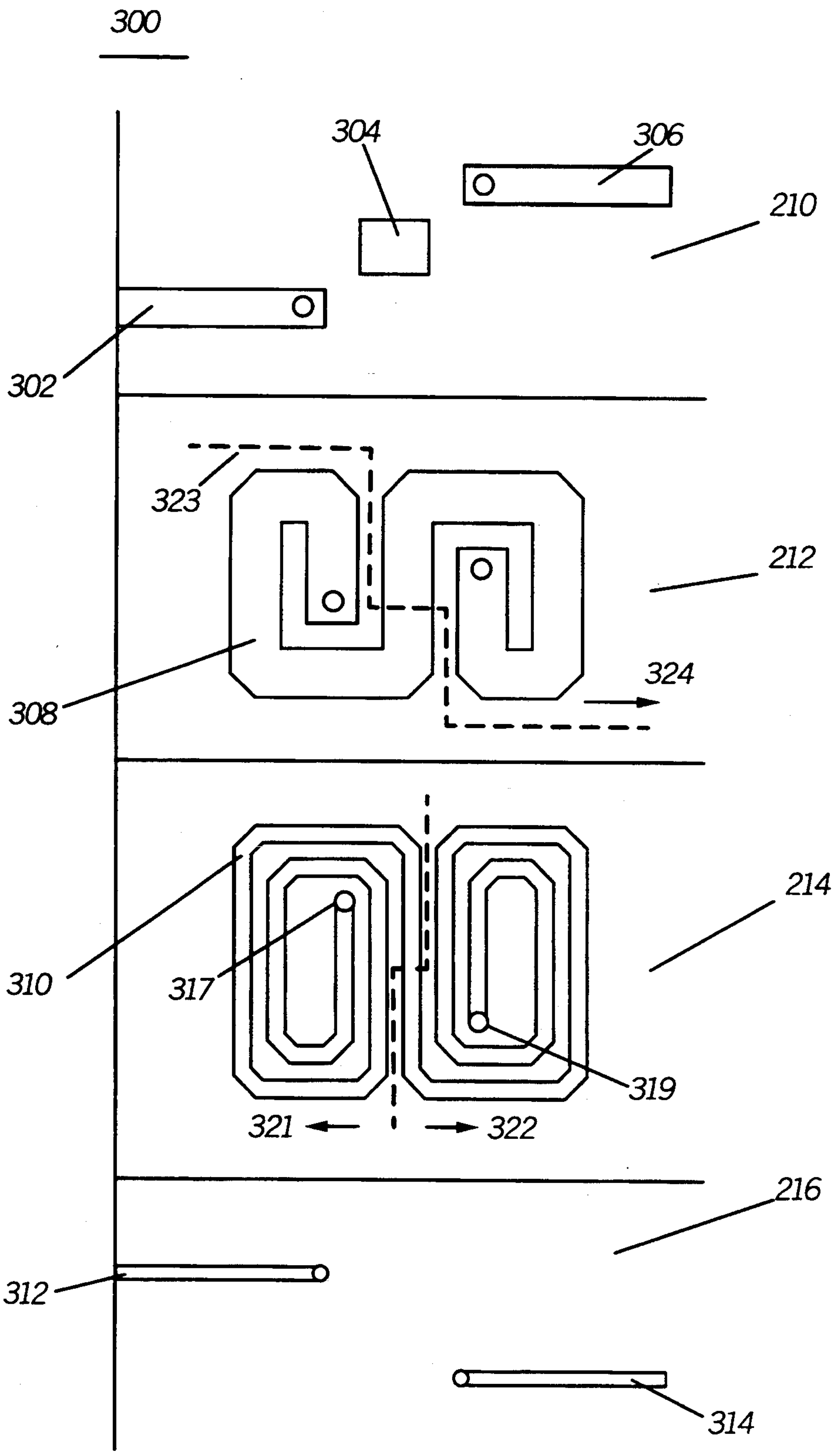
FIG. 3 shows the various layers of a transformer in accordance with the present invention.

Referring to FIG. 3, the various layers of the transformer 300 are shown. The transformer 300 includes the layer 206 with first and second runners 212 and 214 disposed on its two surfaces. The first runner 212 forms a first coil 308 comprising the half coils 323 and 324 of the transformer 300. The first coil 308 is looped to substantially form first and second square spirals on the first surface. The two spirals terminate in first and second terminals (ends) 316 and 320. These spirals are looped in opposite directions to substantially form an S-shape or a FIG. 8 arrangement. A port 318 in the center of the coil 308 provides for a symmetrical center tap 109.

The second runner 214 forms a second coil 310 comprising the half coils 321 and 322 of the transformer 300. The second runner 214 is looped to substantially form first and second square spirals on the second surface. The two spirals terminate in first and second terminals 317 and 319. These spirals are looped in opposite directions to substantially form an S or FIG. 8 arrangement as well. The two coils 308 and 310 are separated by the substrate 206 which is much thinner than the other substrates 204 and 208. The close proximity of the two coils 308 and 310 provide for a strong inductance coupling between them. The layers 210 and 216 are substantially plated to form a ground plane around the selective metallized areas in order to provide for increased shielding of the transformer 300. This shielding suppresses the movement of the electromagnetic flux in the direction away from the two coils. In other words, the electromagnetic flux emanating from the coils 308 and 310 is forced back into the layer 206 which functions as the core for the transformer 300. Since the flux is suppressed in the direction away from the two coils, the surface inductance (horizontal) coupling is minimized. The increased mutual inductance in the vertical direction minimizes the loss in the transformer 300. The benefit of this type of coupling is the improvement in the frequency range in which the transformer 300 could operate.

The metallized layers 210 and 216 provide for input and output ports of the transformer 300. The input port is formed via terminals 312 and 314 which are coupled to the terminals 317 and 319 of the second coil 310. Also, the output port is formed via terminals 302 and 306 which are coupled to the terminals 316 and 320 of the first coil 308. As mentioned the area surrounding the runners 302, 304, 306, 312, and 314 are plated to form a uniform ground plane above and below the coils 308 and 310. For additional shielding a ground layer may be added to top and bottom surfaces 212 and 214.

In summary, a transformer is formed via spiral patterns in a figure eight arrangement in adjacent metal layers between a thin layer of uniform dielectric slab. The relatively small width of the substrate encourages a strong inductance coupling between the primary to secondary coils. Indeed, a coupling coefficient of greater than 0.5 is achieved by choosing the thickness of layer 206 to be one fifth (or smaller) of the layers 204 and 208. This strong coupling provides for the coupling between the primary and secondary coils of the transformer. The horizontal coupling of the two coils is suppressed by having a ground shield over and under the main substrate. This suppression discourages the coupling between the differential primary elements. Such an arrangement provides for a very efficient transformer that will find wide use in amplifier applications.

The preferred embodiment provides for a five-port component with differential to single ended conversion and an impedance translation. The vertical inductance coupling provides for efficient transformation of an amplified signal from the amplifier to the antenna. The suppression of the inductance coupling between the two spirals of the primary coil (horizontal coupling) isolates the push-pull active devices of the amplifier.

What is claimed is:

1. A multi-layer Radio Frequency (RF) balun (Balanced-unbalanced) transformer, comprising:
- a first substantially fiat dielectric substrate having a top and a bottom surface;
- a first runner disposed on the top surface of the dielectric substrate to form two spirals collectively having an S-shape arrangement, the first runner includes first and second ends;
- a second runner disposed on the bottom surface of the dielectric substrate to form two spirals collectively having an S-shape arrangement and being inductively coupled to the first runner, the second runner includes first and second ends;
- a second substantially fiat dielectric substrate, including:
  - a top surface attached to the bottom surface of the first substrate sandwiching the second runner therein;
  - a bottom surface plated with a layer of conductive material to provide a ground plane thereon;
- an input terminal coupled to the first and second ends of the first runner; and
- an output terminal coupled to the first and second ends of the second runner.

2. The transformer of claim 1, wherein the first and second runners include substantially fiat runners.

3. The transformer of claim 1, wherein the first and second spirals include rectangular spirals.

4. The transformer of claim 1, further including a center tap coupled to the first runner between the first and the second ends.

5. The transformer of claim 1, further including a third substantially fiat dielectric substrate, including:
- a top surface;
- a bottom surface attached to the top surface of the first substrate sandwiching the first runner therein.

6. The transformer of claim 5, wherein the top surface of the third substrate is plated with a layer of conductive material to provide a ground plane thereon.

7. The transformer of claim 6 further including a fourth substantially fiat dielectric substrate attached to the plated top surface of the third substrate.

8. The transformer of claim 7, further including a circuit pattern located on the fourth substrate for accommodating electrical components.

9. A radio communication device, comprising:
- an antenna;
- a transmitter for transmitting a radio frequency signal and including an amplifier, the amplifier including a transformer for coupling an amplified signal to the antenna, the transformer having an insertion loss and comprising:
- a first substantially flat dielectric substrate having a top and a bottom surface;
- a first runner disposed on the top surface of the dielectric substrate to form two spirals collectively having an S-type arrangement, the first runner includes first and second ends;
- a second runner disposed on the bottom surface of the dielectric substrate to form two spirals collectively having an S-shape arrangement and being inductively coupled to the first runner, the second runner includes first and second ends;
- a second substantially first dielectric substrate, including:
  - a top surface attached to the bottom surface of the first substrate sandwiching the second runner therein;
  - a bottom surface plated with a layer of conductive material to provide a ground plane thereon;
- an input terminal coupled to the first and second ends of the first runner; and an output terminal coupled to the first and second ends of the second runner.

10. An electrical device, comprising:

a multi-layer RF balun transformer, comprising:

a first substantially fiat dielectric substrate having a top and a bottom surface;

a first runner disposed on the top surface of the dielectric substrate to form two spirals collectively having an S-shape arrangement, the first runner includes first and second ends;

a second runner disposed on the bottom surface of the dielectric substrate to form two spirals collectively having an S-shape arrangement and being inductively coupled to the first runner, the second runner includes first and second ends;

a second substantially fiat dielectric substrate, including:

a top surface attached to the bottom surface of the first substrate sandwiching the second runner therein;

a bottom surface plated with a layer of conductive material to provide a ground plane thereon;

a third substantially fiat dielectric substrate, including:

a top surface plated with a layer of conductive material to provide a ground plane thereon;

a bottom surface attached to the top surface of the first substrate sandwiching the first runner therein a fourth substantially fiat dielectric substrate attached to the plated top surface of the third substrate;

a circuit pattern located on the fourth substrate for accommodating electrical components.

an input terminal coupled to the first and second ends of the first runner; and an output terminal coupled to the first and second ends of the second runner.

* * * * *

UNITED STATES PATENT AND TRADEMARK OFFICE

CERTIFICATE OF CORRECTION

PATENT NO. : 5,451,914

DATED : September 19, 1995

INVENTOR(S) : Robert E. Stengel

It is certified that error appears in the above-indentified patent and that said Letters Patent is hereby corrected as shown below:

Column 4, line 60 delete "first" and insert --flat--

Signed and Sealed this

Twenty-third Day of January, 1996

*Attest:*

BRUCE LEHMAN

*Attesting Officer* *Commissioner of Patents and Trademarks*